United States Patent [19]

Takahira

[11] Patent Number: 5,321,240
[45] Date of Patent: Jun. 14, 1994

[54] NON-CONTACT IC CARD

[75] Inventor: Kenichi Takahira, Itami, Japan

[73] Assignee: Mitsubishi Denki Kabushiki Kaisha, Tokyo, Japan

[21] Appl. No.: 8,507

[22] Filed: Jan. 25, 1993

[30] Foreign Application Priority Data

Jan. 30, 1992 [JP] Japan ................... 4-15205

[51] Int. Cl.$^5$ ............................................ G06K 5/00
[52] U.S. Cl. ................................... 235/380; 235/439; 235/492
[58] Field of Search ................. 235/380, 439, 451, 492

[56] References Cited

U.S. PATENT DOCUMENTS 5,175,418  12/1992  Tanaka ................................ 235/492

FOREIGN PATENT DOCUMENTS 60-160229  8/1985  Japan .
62-134780  6/1987  Japan .

*Primary Examiner*—Harold Pitts
*Attorney, Agent, or Firm*—Leydig, Voit & Mayer

[57] ABSTRACT

A non-contact IC card has a high mechanical strength with respect to bending and twisting, although thin, yet allows the mounting area of a circuit board to be effectively used. A highly rigid, electrically-conducting reinforcing frame is disposed on the outer edge of a circuit board to increase the mechanical strength of the card with respect to bending and twisting. Further, the reinforcing frame is electrically connected to conductor patterns of a spiral coil on the circuit board having an inductance L in an antenna circuit.

4 Claims, 5 Drawing Sheets

FIG. I

NON-CONTACT IC CARD

BACKGROUND OF THE INVENTION

1. Field of the Invention

The present invention relates to a non-contact portable data storage device, generally referred to as a non-contact IC card, which exchanges signals with an external apparatus by using electromagnetic waves or light and, more specifically, to a structure for increasing the mechanical strength of such a storage device.

2. Description of the Related Art

In recent years, non-contact portable storage devices (hereinafter referred to as "non-contact IC cards") which exchange signals with external apparatus by means of electromagnetic waves have been used in various fields. A non-contact IC card includes a circuit board on which circuitry comprising a semiconductor integrated circuit and the like, and an antenna circuit for exchanging signals with an external apparatus are mounted, and which is encased in a card-shaped card body.

FIG. 7 schematically shows, in a block diagram, the functional arrangement of a non-contact IC card of the above-described kind. The card includes a CPU 1 for data processing and control within the non-contact IC card, the CPU 1 being connected via a bus 8 with a ROM 2 and a RAM 3 together being part of a data storage section, and an input/output control circuit 4. The input/output control circuit 4 controls data to be input to or output from the card, and is connected with an antenna circuit 6 through a modulating-demodulating (MODEM) circuit 5. A battery 7 is provided to supply power to the above-described components. The antenna circuit 6 exchanges signals with an external apparatus (not shown) by means of electromagnetic waves 6a.

FIG. 8 is a perspective plan view for explaining an actual internal structure of a conventional non-contact IC card. FIG. 9 is a sectional view of the card, taken along line IX—IX shown in FIG. 8. In FIG. 8, the card is shown in a state where a molding resin 13 sealing a circuit board 11 and various components thereon is removed. Referring to these figures, a non-contact IC card 10 includes a circuit board 11 and, in the center of the circuit board 11, an IC 9, other circuit elements 9a, a battery 7, mounted in such a manner as to be connected with each other by a circuit pattern 11a on the circuit board 11. The circuit elements 9a comprise a capacitor, an inductance, a resistor and the like. Elements corresponding to those denoted by reference numerals 1 through 5 and reference numeral 8 in FIG. 7 are provided within the IC 9.

The non-contact IC card 10 also includes an antenna circuit 6 comprising a spiral coil 61 provided on the outer peripheral portion of the circuit board 11, and a capacitor 63. The spiral coil 61 and the capacitor 63 are connected in parallel as an LC parallel resonance circuit across which a voltage induced in the circuit by electromagnetic waves in the vicinity of the resonance frequency appears. The spiral coil 61 comprises a pair of spiral-shaped conductor patterns 61a and 61b respectively on first and second major surfaces of the circuit board 11. The conductor pattern 61a and 61b respectively on point A (shown in FIG. 8) on the first major surface, or the front surface, of the circuit board 11, and is connected, by passing through a through-hole 12a, to the other conductor pattern 61b on the second major surface, or the back surface, of the circuit board 11. The back-surface conductor pattern 61b extends in a spiral shape from the through-hole 12a to an inward location, and has an inner end passed through another through hole 12b and connected to, for instance, the ground side, of the battery 7 on the front surface.

The spiral coil 61 has an inductance L, and is connected in parallel with the capacitor 63 having a capacitance C. The circuit board 11 having the above-described construction is encapsulated in a molding resin 13, comprising a resin such as a non-electrically-conductive resin, for forming a card body, so as to minimize external influence on the transmission of electromagnetic fields. Another example of the card body is a hollow casing comprising, for instance, a frame body and a pair of panels.

A conventional non-contact portable storage device (non-contact IC card) having the above-described construction has the following problem. When the card has a relatively large thickness, it is possible to assure the necessary mechanical strength with respect to bending or twisting only by adopting a suitable resin composition. However, when the thickness of the card is to be reduced (for instance, to a thickness of the order of 1 mm), it becomes difficult to assure the necessary mechanical strength only by adjusting the resin composition. A method which may be adopted to assure the necessary mechanical strength comprises providing an electrically-conductive metal cover. However, such a cover can, as a matter of course, have a great influence on the transmission of electromagnetic fields, and the method is not practical.

SUMMARY OF THE INVENTION

The present invention has been accomplished to overcome the above-described problem. An object of the present invention is to provide a non-contact portable storage device of sufficient mechanical strength with respect to bending or twisting even when the device is thin.

In order to achieve the above object, according to the present invention, there is provided a non-contact portable storage device having an antenna circuit for exchanging signals with an external apparatus by means of electromagnetic waves, the storage device comprising: a circuit board; circuitry mounted on a central location of the circuit board for processing, control, and storage; an electrically-conductive reinforcing frame disposed along the circumference of an outer edge of the circuit board, the electrically-conductive reinforcing frame having a gap corresponding to a portion of the circumference, the electrically-conductive reinforcing frame forming part of an antenna circuit; an antenna circuit electrically connected to the circuitry, the antenna circuit comprising a spiral coil in conformity with the outer edge of the circuit board and electrically connected in series with the electrically-conductive reinforcing frame, and a capacitor at the function circuitry, the antenna circuit including a resonance circuit in which the spiral coil and the electrically-conductive reinforcing frame together have an inductance L, and in which the capacitor has a capacitance C; and a casing made of a non-electrically-conductive material and encasing all of the above-stated components.

With a non-contact portable storage device according to the present invention, an electrically-conductive reinforcing frame having a high rigidity and provided on the outer edge of a circuit board increases the mechanical strength of the thin, card-shaped device with respect to bending or twisting. In addition, the electrically-conductive reinforcing frame is a part of the inductance of an antenna circuit.

DESCRIPTION OF THE PREFERRED EMBODIMENTS

Embodiments of the present invention will now be described with reference to the accompanying drawings.

Figure 1:
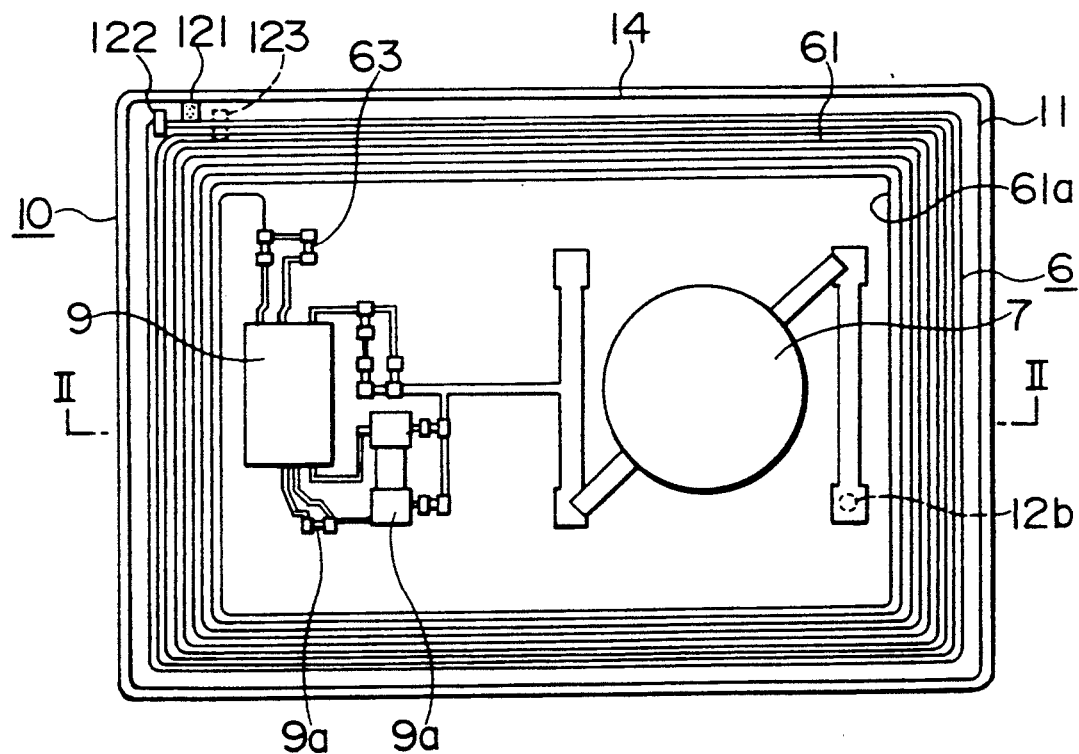
FIG. 1 is a perspective plan view showing an internal structure of a non-contact portable storage device according to a first embodiment of the present invention.
Figure 2:
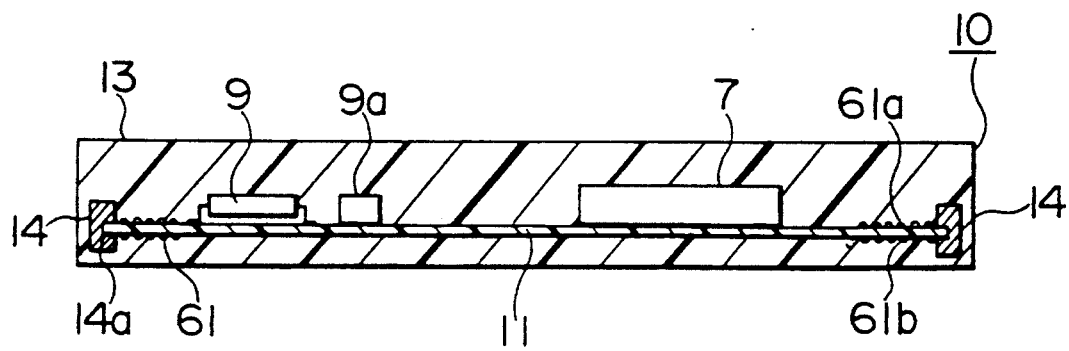
FIG. 2 is a cross-sectional view of the device shown in FIG. 1, taken along line II—II shown in FIG. 1.
Figure 3:
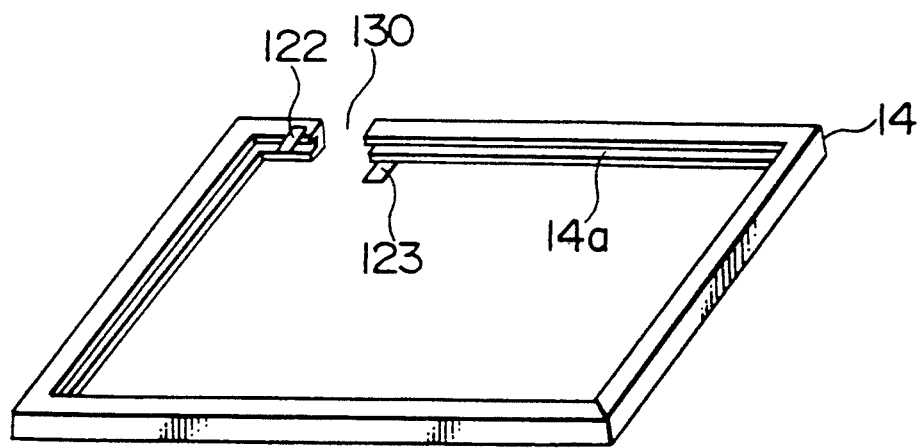
FIG. 3 is a perspective view showing a U-shaped reinforcing frame of the device shown in FIG. 1.

A non-contact-type portable storage device (non-contact IC card) according to a first embodiment of the present invention is shown in FIGS. 1 through 3, FIG. 2 being a perspective plan view for explaining the internal structure of the device, and FIG. 2 being a cross-sectional view taken along line II—II shown in FIG. 1. In the above and the other drawings, components which are the same as or correspond to those of the conventional device are denoted by identical reference numerals, and the description of these components will be omitted. The first embodiment of the present invention includes a U-shaped reinforcing frame 14 (electrically-conductive reinforcing frame) extending along the circumference of an outer edge of the circuit board 11. The U-shaped reinforcing frame 14 is shown in a perspective view in FIG. 3.

The U-shaped reinforcing frame 14 has a recess 14a opening inward and extending in the longitudinal direction of the frame 14. The U-shaped reinforcing frame 14 extends along the circumference of the outer edge of the circuit board 11 with the outer edge being fitted in the recess 14a, and the frame 14 is thus fixed in position. The reinforcing frame 14 increases the mechanical strength of the card with respect to bending or twisting, and also is a part of the coil section of an antenna circuit 6. For this purpose, the electrically-conductive reinforcing frame 14 is made of a highly-rigid, electrically-conductive material, such as a stainless-steel-based or duraluminum material. As shown in FIG. 3, the U-shaped reinforcing frame 14 has a gap 130 formed in a portion thereof. During the assembly of the reinforcing frame 14 on the circuit board 11, the gap 130 is filled with an insulating adhesive resin 121, as shown in FIG. 1, whereby the ends of the reinforcing frame 14, confronting each other with the gap 130 therebetween, are electrically insulated from each other, and the reinforcing frame 14 is simultaneously secured to the circuit board 11.

Figure 8:
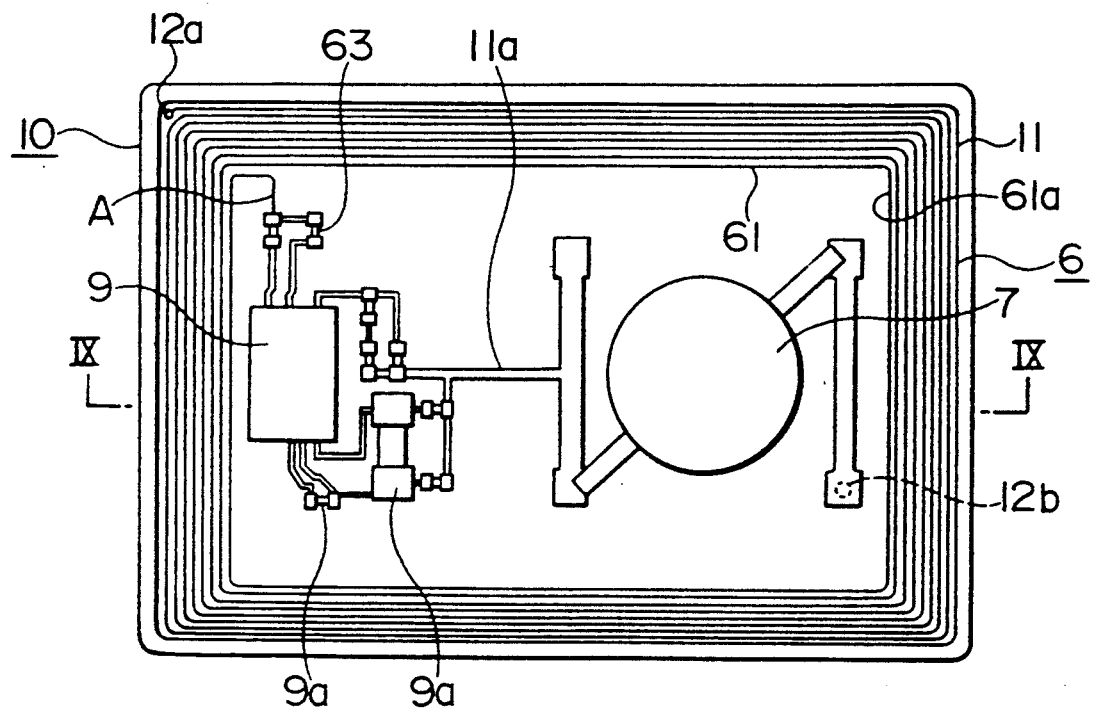
FIG. 8 is a perspective plan view showing an internal structure of a conventional non-contact portable storage device.
Figure 9:
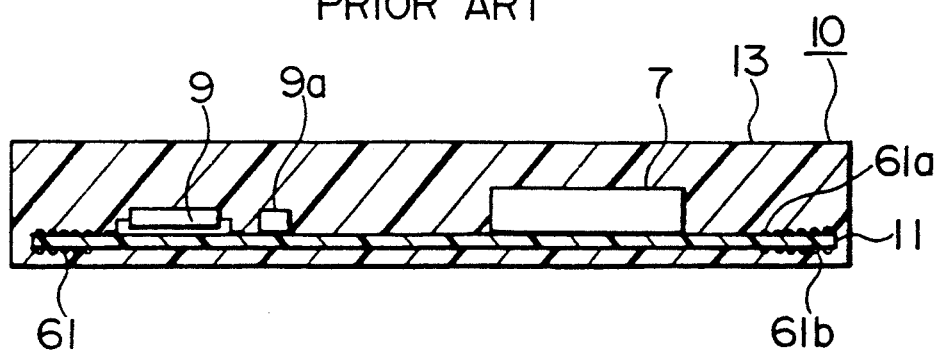
FIG. 9 is a cross-sectional view of the conventional device shown in FIG. 8, taken along line IX—IX shown in FIG. 8.

The reinforcing frame 14 also has a pair of electrically-conductive connecting members 122 and 123 provided at the ends on either side of the gap 130. During the assembly of the reinforcing frame 14 on the circuit board 11, the connecting members 122 and 123 are connected by soldering or the like to spiral-shaped conductor patterns in a certain manner. For instance, the connecting member 122 is connected to the outer end of a conductor pattern 61a on a first major surface (front surface) of the circuit board 11 on which circuitry is mounted, and the connecting member 123 is connected to the outer end of another conductor pattern 61b on a second major surface (back surface) of the circuit board 11. Such connection forms a coil structure in which the front-surface conductor pattern 61a, the connecting member 122, the reinforcing frame 14, the other connecting member 123 and the back-surface conductor pattern 61b are successively connected together in series as an inductance L of an antenna circuit 6. Since the reinforcing frame 14 connects the pair of conductor patterns 61a and 61b on the front and back surfaces, respectively, of the circuit board 11, it is unnecessary to provide a through-hole 12a, shown in FIG. 8, which has been formed in an outer peripheral position of the circuit board of a conventional card in order to interconnect the conductor patterns on the front and back surfaces of the circuit board.

Figure 4:
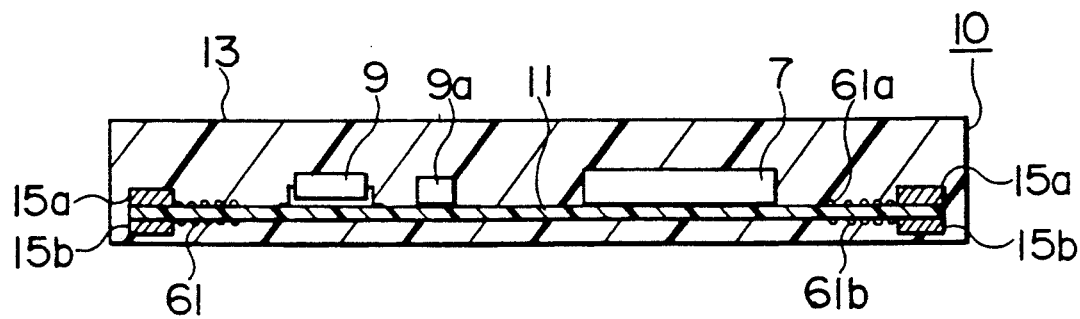
FIG. 4 is a cross-sectional view of a non-contact portable storage device according to a second embodiment of the present invention.

A non-contact IC card according to a second embodiment of the present invention is shown in a cross-sectional view in FIG. 4. This embodiment includes an electrically-conductive reinforcing frame comprising a pair of bar-shaped reinforcing-frame elements 15a and 15b which extend along the circumference of a pair of outer edge locations of the front surface and the back surface, respectively, of a circuit board 11 in such a manner that the circuit board 11 is held between the front-surface and the back-surface reinforcing-frame elements 15a and 15b. The reinforcing-frame elements 15a and 15b are formed of a highly-rigid, electrically-conductive material so that they both to increase the mechanical strength of the card and are part of the coil section of an antenna circuit 6.

Figure 5:
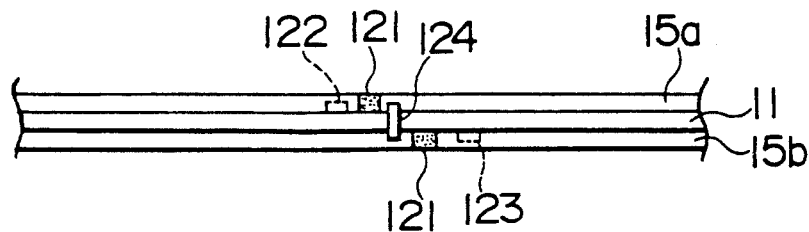
FIG. 5 is a side view of a circuit board and associated components of the device shown in FIG. 4.

FIG. 5 is an enlarged side view showing a side portion of the circuit board 11 at which the reinforcing-frame elements 15a and 15b on the front and back surfaces of the circuit board 11 are joined together. Referring to FIG. 5, the reinforcing-frame elements 15a and 15b have gaps filled with an insulating adhesive resin 121. Further, an electrically-conductive connecting member 124 connects one end of the reinforcing-frame element 15a to one end of the other reinforcing-frame element 15b so as to interconnect one turn of the coil formed by the reinforcing-frame element 15a and another turn of coil formed by the other reinforcing-frame element 15b. Further electrically-conductive connecting members 122 and 123 connect, by soldering or the like, the other ends of the reinforcing-frame elements 15a and 15b to spiral conductor patterns 61a and 61b in the following manner: the electrically-conductive connecting member 122 connects the other end of the reinforcing-frame element 15a to the outer end of the front-surface conductor pattern 61a; and the electrically-conductive connecting member 123 connects the other end of the reinforcing-frame element 15b to the outer end of the back-surface conductor pattern 61b.

This connection forms a coil structure in which the front-surface conductor pattern 61a, the connecting member 122, the front-surface reinforcing-frame element 15a, the connecting member 124, the back-surface reinforcing-element 15b, the connecting member 123, and the back-surface conductor pattern 61b are successively connected together in series as an inductance L of an antenna circuit 6. The construction of the second embodiment provides similar effects to those provided by the first embodiment. The reinforcing-frame elements 15a and 15b may be interconnected by forming a through hole in a circuit board 11 instead of using the connecting member 124.

Figure 6:
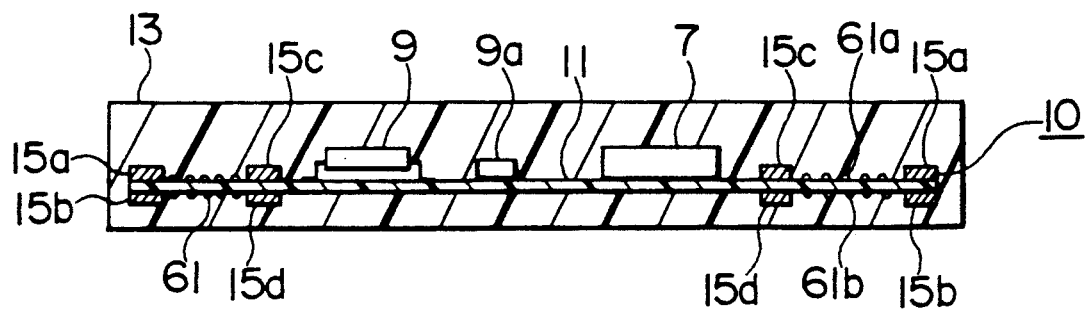
FIG. 6 is a cross-sectional view of a non-contact portable storage device according to a third embodiment of the present invention.
Figure 7:
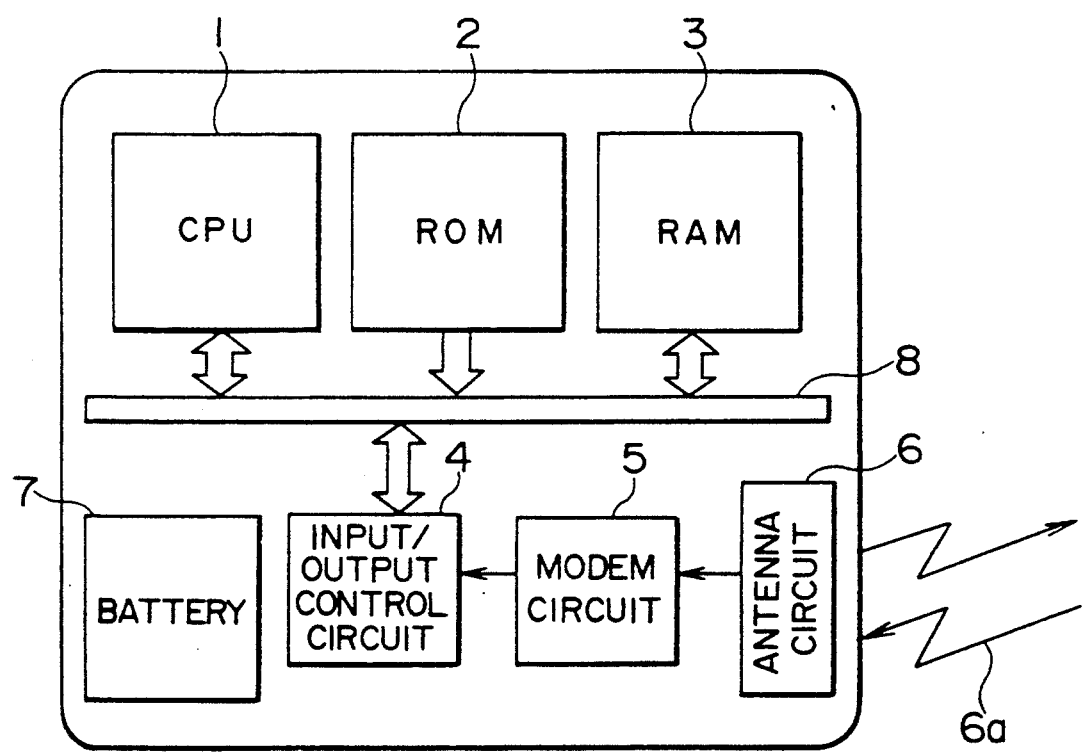
FIG. 7 is a block diagram showing the functional arrangement of a non-contact portable storage device of the relevant type.

FIG. 6 shows, in a cross-sectional view, a non-contact IC card according to a third embodiment of the present invention. This embodiment includes an electrically-conductive reinforcing frame comprising a first pair of bar-shaped reinforcing-frame elements 15a and 15b provided at a position outward of conductor patterns 61a and 61b on the front surface and the back surface, respectively, of a circuit board 11, and a second pair of bar-shaped reinforcing-frame elements 15c and 15d provided at a position inward of the conductor patterns 61a and 61b. The reinforcing-frame elements 15a to 15d extend along the circumference of corresponding outer edge locations of the circuit board 11 in such a manner that the circuit board 11 is held between the front-surface reinforcing-frame elements 15a and 15c and the back-surface reinforcing-frame elements 15b and 15d. The reinforcing-frame elements 15a to 15d are formed of a highly-rigid, electrically-conductive material so that they serve both to increase the mechanical strength of the card and as part of the coil section of an antenna circuit 6.

With this construction, a coil structure has the front-surface inner reinforcing-frame element 15c, the conductor pattern 61a, the front-surface outer reinforcing-frame element 15a, the back-surface outer reinforcing-element 15b, the other conductor pattern 61b, and the back-surface inner reinforcing-frame element 15d successively connected together in series, as an inductance L of an antenna circuit 6. In this embodiment, connections between the reinforcing-frame elements and the corresponding conductor patterns and between the front-surface and back-surface reinforcing-frame elements are established by using electrically-conductive connecting members and a through hole in similar manners as those in the above embodiment. The construction of the third embodiment provides similar effects to those provided by the foregoing embodiments. Only the inner reinforcing-frame elements 15c and 15d may be provided, and, even in this case, substantial effects are achieved.

Although in the foregoing embodiments the U-shaped reinforcing frame 14 or the bar-shaped reinforcing-frame elements 15a to 15d extend over substantially the full circumference of the circuit board, the frame 14 or the frame elements 15a to 15d may alternatively extend over, for instance, three sides out of the four of the circuit board, and this construction provides similar effects. Further, although in each embodiment a casing for encasing the circuit board and the associated components is formed of a molding resin 13, the casing may alternatively comprise, for instance, a hollow casing of a resin having a frame body and panels for front and back sides.

As described above, with a non-contact portable storage device (non-contact IC card) using electromagnetic waves according to the present invention, since a highly-rigid, electrically-conductive reinforcing frame is provided on the outer edge of a circuit board, it is possible to increase the mechanical strength of the device with respect to bending and twisting. Further, the electrically-conductive reinforcing frame is electrically connected as a part of the inductance of an antenna circuit. Thus, the present invention makes it possible to provide a portable storage device which has a high mechanical strength through thin and in which the mounting area of a circuit board is effectively used.

What is claimed is:

1. A non-contact IC card for exchanging signals with an external apparatus by means of electromagnetic waves comprising:

a circuit board;
   circuitry centrally mounted on said circuit board for data processing, control, and storage;
   an electrically-conductive reinforcing frame along an outer edge of said circuit board around said circuitry, said electrically-conductive reinforcing frame having a gap;
   an antenna circuit electrically connected to said circuitry and comprising a spiral coil along said outer edge of said circuit board and electrically connected in series with said electrically-conductive reinforcing frame and a capacitor on said circuit board at said circuitry, said spiral coil and said electrically-conductive reinforcing frame together having an inductance L and said capacitor having a capacitance C; and
   a casing of a non-electrically-conductive material encapsulating said circuit board, circuitry, and reinforcing frame.

2. The non-contact IC card according to claim 1 wherein said circuit board has opposing first and second major surfaces, said circuitry being disposed on one of said major surfaces of said circuit board, said spiral coil of said antenna circuit comprising a pair of conductor patterns disposed on respective outer peripheral locations of said first and second major surfaces of said circuit board, said electrically-conductive reinforcing frame comprising a U-shaped reinforcing frame extending along said outer edge of said circuit board, said U-shaped reinforcing frame having a longitudinal recess in which said outer edge of said circuit board is received, said conductor pattern on said first major surface of said circuit board, said U-shaped reinforcing frame, and said conductor pattern on said second major surface of said circuit board being electrically connected in series.

3. The non-contact IC card according to claim 1 wherein said circuit board has opposing first and second major surfaces, said circuitry being disposed on one of said major surfaces of said circuit board, said spiral coil of said antenna circuit comprising a pair of conductor patterns disposed on respective outer peripheral locations of said first and second major surfaces of said circuit board, said electrically-conductive reinforcing frame comprising bar-shaped reinforcing frame elements extending along said outer edge of said circuit board and including gaps, said bar-shaped reinforcing frame elements holding therebetween said circuit board at said first and second major surfaces, said bar-shaped reinforcing frame elements and said conductor patterns on said first and second major surfaces of said circuit board being electrically connected in series successively from said first major surfaces of said circuit board to said second major surface of said circuit board as a single coil structure.

4. The non-contact IC card according to claim 1 wherein said electrically-conductive reinforcing frame is one of stainless-steel-based and duraluminum-based material.

* * * * *